(12) United States Patent
Ishigami et al.

(10) Patent No.: US 6,861,904 B2
(45) Date of Patent: Mar. 1, 2005

(54) FEED FORWARD AMPLIFICATION APPARATUS FOR COMPENSATING NON-LINEAR DISTORTION

(75) Inventors: Takeshi Ishigami, Tokyo (JP); Kotaro Takenaga, Tokyo (JP); Hiroichi Yonenaga, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/127,564

(22) Filed: Apr. 23, 2002

(65) Prior Publication Data

US 2003/0052734 A1 Mar. 20, 2003

(30) Foreign Application Priority Data

Sep. 20, 2001 (JP) .......................................... 2001-287302

(51) Int. Cl.[7] ................................................. H03F 1/00
(52) U.S. Cl. ........................................ 330/151; 330/149
(58) Field of Search ................................. 370/147, 151, 370/52; 375/297; 455/63

(56) References Cited

U.S. PATENT DOCUMENTS 4,943,783 A * 7/1990 Nojima ........................ 330/149
5,576,659 A * 11/1996 Kenington et al. ............ 330/52
6,133,791 A * 10/2000 Horiguchi et al. ........... 330/151

* cited by examiner

Primary Examiner—Henry Choe
(74) Attorney, Agent, or Firm—Bacon & Thomas, PLLC

(57) ABSTRACT

A feed forward type distortion compensation amplification apparatus includes a first division unit for dividing an input signal into a first channel signal and a second channel signal, a main amplifier for amplifying the first channel signal, a variable attenuation unit for processing the second channel signal to provide an amplitude adjusted second channel signal, a delay unit for delaying the amplitude adjusted second channel signal, a second division unit for dividing an output signal of the main amplifier into a third channel signal and a fourth channel signal and subtracting one of the third channel signal and the delayed second channel signal from the other to extract a distortion component introduced by the main amplifier, and a distortion compensation unit for removing a distortion component introduced into the fourth channel signal by the main amplifier, by using the distortion component extracted by the second division unit.

1 Claim, 3 Drawing Sheets

FEED FORWARD AMPLIFICATION APPARATUS FOR COMPENSATING NON-LINEAR DISTORTION

FIELD OF THE INVENTION

The present invention relates to a non-linear distortion compensation amplification apparatus including a main amplifier for amplifying an input signal and a feed forward loop for compensating distortion generated by the main amplifier; and more, particularly, to the apparatus and a control method for optimizing the feed forward loop for compensating the distortion generated by the main amplifier.

BACKGROUND OF THE INVENTION

In a mobile communications system, a base station transmits an amplified high frequency multi-carrier signal having a plurality of carriers separated from each other by different frequency bands and respectively modulated in proper ways. Since, however, an amplification apparatus with a poor linearity produces various kinds of distortion, e.g., inter-modulation distortion, the amplification apparatus for use in the amplification of the high frequency multi-carrier signal is required to exhibit good linearity characteristics across the whole frequency band the multi-carrier signal belongs to.

One of known various methods for realizing an ultra low distortion amplification apparatus suitable for the amplification of, e.g., a multi-carrier signal is to employ a feed forward (referred to as "FF" hereinafter) distortion compensation technique.

The conventional FF amplification technique is implemented by a main line, for amplifying an input multi-carrier signal by a main amplifier and outputting the amplified multi-carrier signal, and a FF loop. The FF loop includes a distortion detection loop for detecting a distortion component generated by the main amplifier from the amplified multi-carrier signal and a distortion compensation loop for canceling the distortion component from the amplified multi-carrier signal by using the distortion component detected in the distortion detection loop.

A conventional non-linear distortion compensation amplification apparatus using such FF amplification technique is disclosed in, for example, Japanese Patent Laid-Open Publication No. 1995-303050 or 1996-307161. The basic configuration and operation of such conventional non-linear distortion compensation amplification apparatus are described with reference to FIG. 3, which includes an input terminal 1, dividers 2, 7 and 12, variable attenuators 3 and 9, variable phase shifters 4 and 10, a main amplifier 5, coaxial delay lines 6 and 8, an auxiliary amplifier 11, an output terminal 13, a control unit 14 and a control signal generation circuit 15.

Referring to FIG. 3, a signal path from the input terminal 1 to the output terminal 13 via the divider 2, the main amplifier 5, the divider 7, the coaxial delay line 8 and the divider 12 forms a main line. On the main line, an input signal (a multi-carrier signal in this embodiment) from the input terminal 1 is divided into a main divided signal and a subsidiary signal by the divider 2. The main divided signal is provided to the main amplifier 5 via the variable attenuator 3 and the variable phase shifter 4 and is high-frequency-amplified by the main amplifier 5. The amplified multi-carrier signal (signal A) is divided into a primary divided signal E and a secondary divided signal (signal C) by the divider 7. The primary divided signal E is delayed by the coaxial delay line 8 by a first predetermined amount and then is outputted to the output terminal 13 by passing through the divider 12.

In case where the main amplifier 5 does not exhibit a good linearity for example, there occurs on such main line inter-modulation of a carrier in the multi-carrier signal. Accordingly, various distortions including, e.g., inter-modulation distortion caused by the inter-modulation of the multi-carrier of the input signal are produced and then mixed into the multi-carrier signal.

In order to remove such distortion, a distortion detection loop L1 and a distortion compensation loop L2 of the FF loop are installed in such non-linear distortion compensation amplification apparatus. The distortion detection loop L1 detects a distortion component, which is generated by the main amplifier 5 and then is mixed into the multi-carrier signal, and the distortion compensation loop L2 removes the distortion component mixed into the multi-carrier signal by using such distortion component detected from the distortion detection loop L1.

The distortion detection loop L1 is configured by the variable attenuator 3, the variable phase shifter 4, the main amplifier 5, the coaxial delay line 6 and the dividers 2 and 7. In the distortion detection loop L1 of such configuration, the multi-carrier signal inputted from the input terminal 1 is provided to the divider 2 and divided into the main divided and the subsidiary signal as mentioned above. The main divided signal is provided to the main line and the subsidiary signal is delayed in the coaxial delay line 6 by a second predetermined amount and then is provided to the divider 7 as a divided signal B.

The divider 7 functions to divide the output signal A of the main amplifier 5 into the primary divided signal E and the secondary divided signal C and provides the primary divided signal E of the output signal A to the coaxial delay line 8 on the main line. The divider 7 further serves to subtract the divided signal B of the coaxial delay line 6 from the subordinate signal of the output signal A provided by the main amplifier 5 to provide a difference signal D. The difference signal D obtained in the subtraction process is provided to the variable attenuator 9 of the distortion compensation loop L2.

The amount of delay in the coaxial delay line 6 is set to be equal to the total amount of delay of the variable attenuator 3, the variable phase shifter 4 and the main amplifier 5. The amount of attenuation of the variable attenuator 3 is set in such a manner that an amplitude of the secondary divided signal C separated from the output signal A by the divider 7 is identical to that of the divided signal B of the coaxial delay line 6. Further, the amount of phase shift of the variable phase shifter 4 is set such that a phase of the secondary divided signal C coincides with that of the divided signal B.

Therefore, the difference signal D outputted from the divider 7 corresponds to such distortion component as inter-modulation distortion generated by the main amplifier 5. The amount of attenuation of the variable attenuator 3 and the amount of phase shift of the variable chase shifter 4 are respectively controlled by control signals G1 and θ1 generated from the control signal generation circuit 15 of the control unit 14 in such a manner that the difference signal D includes only the distortion component.

The distortion compensation loop L2 is configured by the coaxial delay line 8, the variable attenuator 9, the variable phase shifter 10, the auxiliary amplifier 11 and the dividers 7 and 12. In the distortion compensation loop L2 of such configuration, the primary divided signal E, a multi-carrier signal, that is, the main signal of the output signal A from the main amplifier 5 obtained by the divider 7, is delayed in the coaxial delay line 8 by the first predetermined amount and then is provided to the divider 12.

Further, the distortion component D obtained by the divider 7 is provided to the auxiliary amplifier 11 via the variable attenuator 9 and the variable phase shifter 10. A distortion component F, which corresponds to the distortion component D amplified by the auxiliary amplifier 11, is provided to the divider 12. The divider 12 has a subtraction function, to thereby subtract the distortion component F provided by the auxiliary amplifier 11 from the multi-carrier signal E of the coaxial delay line 8. Accordingly, a multi-carrier signal G free from the distortion component generated by the main amplifier 5 is obtained and then outputted to the output terminal 13.

Herein, the amount of delay on the coaxial delay line 8 is set to be equal to the total amount of delay of the variable attenuator 9, the variable phase shifter 10 and the auxiliary amplifier 11. The amount of attenuation of the variable attenuator 9 is set in a fashion that the amplitude of the distortion component mixed into the multi-carrier signal E outputted from the divider 7 is identical to that of the distortion component F of the auxiliary amplifier 11. Further, the amount of phase shift of the variable phase shifter 10 is set in such a manner that a phase of the distortion component F of the auxiliary amplifier 11 is inverted with respect to that of the distortion component mixed into the multi-carrier signal.

Therefore, when the described setting amounts are precisely set, the multi-carrier signal G, in which the distortion component is cancelled out, is obtained at the divider 12. The amount of attenuation of the variable attenuator 9 and that of phase shift of the variable phase shifter 10 are respectively controlled by control signals G2 and 02 generated from the control signal generation circuit 15 of the control unit 14, so that the cancellation of the distortion component can be appropriately achieved.

In the Japanese Patent Laid-Open Publication No. 1996-307161, the amounts of delay of the variable attenuators 3 and 9 and phase shift of the variable phase shifters 4 and 10 are set when the power is applied in such FF amplification apparatus. For this, there are provided a monitor for monitoring the output signal G of the divider 12, a temperature detector, and a memory table having control signals specifying the amounts of attenuation of the variable attenuators 3 and 9 and those of phase shift of the variable phase shifters 4 and 10 with respect to detected output levels of the monitor and the detected temperatures of the temperature detector. Control signals corresponding to a detected output level and a detected temperature are read from the memory table to thereby control the amounts of attenuation of the variable attenuators 3 and 9 and those of phase shift of the variable phase shifters 4 and 10.

Accordingly, the distortion component can be suppressed to be minimal at the beginning of the power application. Further, in case where a gain fluctuation is caused by a fault of the main amplifier 5 or the auxiliary amplifier 11 during a normal operation, a discrepancy is detected between an actual control signal being currently used and a normal control signal specified in the memory table corresponding to the currently detected output level and temperature. An alarm signal is issued based on the detection of the discrepancy, to thereby announce the faulted state of the apparatus.

Further, the conventional technique disclosed in Japanese Patent Laid-Open Publication No. 1995-303050 sets the amounts of attenuation of the variable attenuators 3 and 9 and phase shift of the variable phase shifters 4 and 10 by using pilot signals, wherein a variable attenuator and a variable phase shifter in combination are referred to as a vector modulator.

That is, in FIG. 3, a first pilot signal is inputted from the input terminal 1 and a second pilot signal is inputted to the divider 7 at the output end of the main amplifier 5. The first pilot signal is extracted from the difference signal D from the divider 7 to check the distortion detection loop L1 and the vector modulator, i.e., the variable attenuator 3 and the variable phase shifter 4, of the distortion detection loop L1 is controlled in such a manner that the difference signal D is free from the first pilot signal.

Further, the second pilot signal is checked whether it is included in the output signal G of the divider 12 and a setting value of the vector modulator, i.e., the variable attenuator 9 and the variable phase shifter 10, of the distortion compensation loop L2 is controlled such that the second pilot signal is prevented from being included in the output G.

In the conventional technique disclosed in Japanese Patent Laid-Open Publication No. 1995-303050, the detection levels of the first and the second pilot signal can be almost zero if the proper compensation is carried out. However, if the system is in a faulted state, e.g., if the main amplifier 5 is out of order, the detected levels do not become and may exceed a predetermined level. Then the system informs an operator or a maintenance personnel on such case and cuts off power at the same time.

As described above, if the main amplifier 5 normally operates, the conventional FF amplification apparatus as shown in FIG. 3 can set the amount of attenuation of the variable attenuator 3 and that of phase shift of the variable phase shifter 4 in such a fashion that the difference signal D outputted from the divider 7 contains distortion component only. However, if a gain of the main amplifier 5 is reduced, e.g., by a fault of a component of the main amplifier 5, the gain reduction of the main amplifier 5 may not be compensated by the amount of attenuation of the variable attenuator 3. That is, the gain of the main amplifier 5 may be reduced to exceed an adjustable range of attenuation of the variable attenuator 3.

In such case, the conventional technique disclosed in Japanese Patent Laid-Open Publication No. 1996-307161 posts an alarm on detecting such faulted state, while the conventional technique disclosed in Japanese Patent Laid-Open Publication No. 1995-303050 informs the case and simultaneously cuts off power.

However, if cutting off the power upon detecting the malfunction of the main amplifier, a mobile communications base station and a relay station using such FF-amplification apparatus are disenabled, to thereby unable to perform mobile communications. Further, if merely posting an alarm while maintaining the operation of the FF amplification apparatus as it is, as disclosed in Japanese Patent Laid-Open Publication No. 1996-307161, the amplitude of the secondary divided signal C of the output signal A of the main amplifier 5 cannot be make to coincide with that of the divided signal B of the coaxial delay line 6. Accordingly, the difference signal D outputted from the divider 7 will include carriers of the multi-carrier signal as well as distortion components. Further, since the amplitude of the distortion component in the output signal F of the auxiliary amplifier 11 cannot be equal to that of the distortion component in the multi-carrier signal E on the coaxial delay line 8, the distortion component remains in the output signal G from the divider 12.

SUMMARY OF THE INVENTION

It is, therefore, an object of the present invention to provide a feed forward type non-linear distortion compensation amplification apparatus capable of continuing its operation while effectively reducing a distortion component generated by a main amplifier, even in the case where the main amplifier malfunctions due to, e.g., a breakdown of an amplification element.

In accordance with a preferred embodiment of the present invention, there is provided a feed forward type distortion compensation amplification apparatus, including: a first division unit for dividing an input signal into a first channel signal and a second channel signal; a main amplifier for amplifying the first channel signal; a variable attenuation unit for processing the second channel signal to provide an amplitude adjusted second channel signal; a delay unit for delaying the amplitude adjusted second channel signal to compensate for a delay of the first channel signal; a second division unit for dividing an output signal of the main amplifier into a third channel signal and a fourth channel signal and subtracting one of the third channel signal and the delayed second channel signal from the other to extract a distortion component introduced by the main amplifier; and a distortion compensation unit for removing a distortion component introduced into the fourth channel signal by the main amplifier, by using the distortion component extracted by the second division unit.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
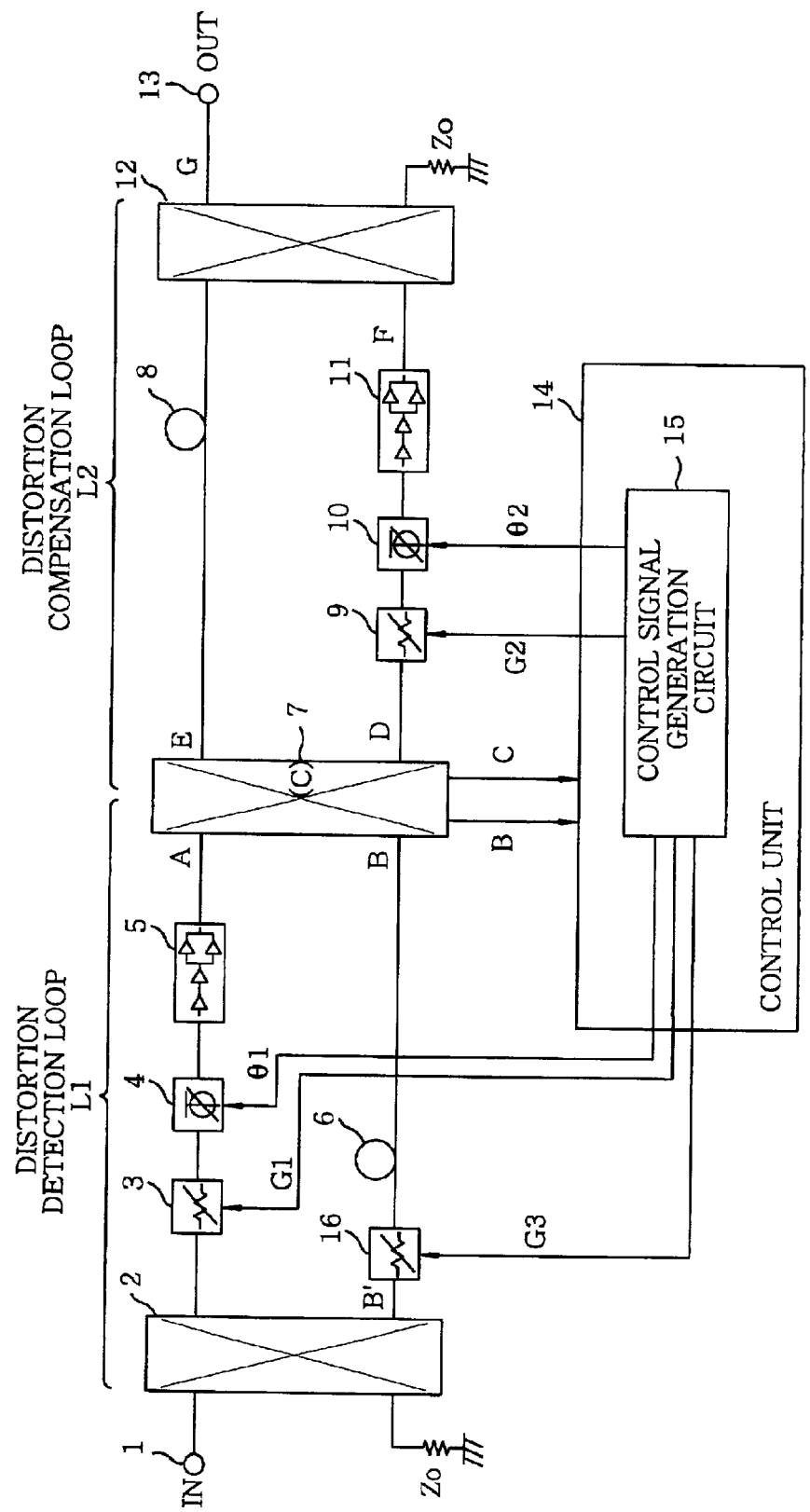
FIG. 1 shows a block diagram illustrating a feed forward type non-linear distortion compensation amplification apparatus in accordance with a first preferred embodiment of the present invention.

FIG. 1 shows a block diagram illustrating a feed forward type non-linear distortion compensation amplification apparatus in accordance with a first preferred embodiment of the present invention. Since some elements of the apparatus shown in FIG. 1 are identical to those of the conventional apparatus shown in FIG. 3, the same reference numerals are used to denote and identify corresponding or identical elements to those of the conventional apparatus and the repeated description thereof will be omitted. Herein, a reference numeral 16 denotes a variable attenuator.

Figure 3:
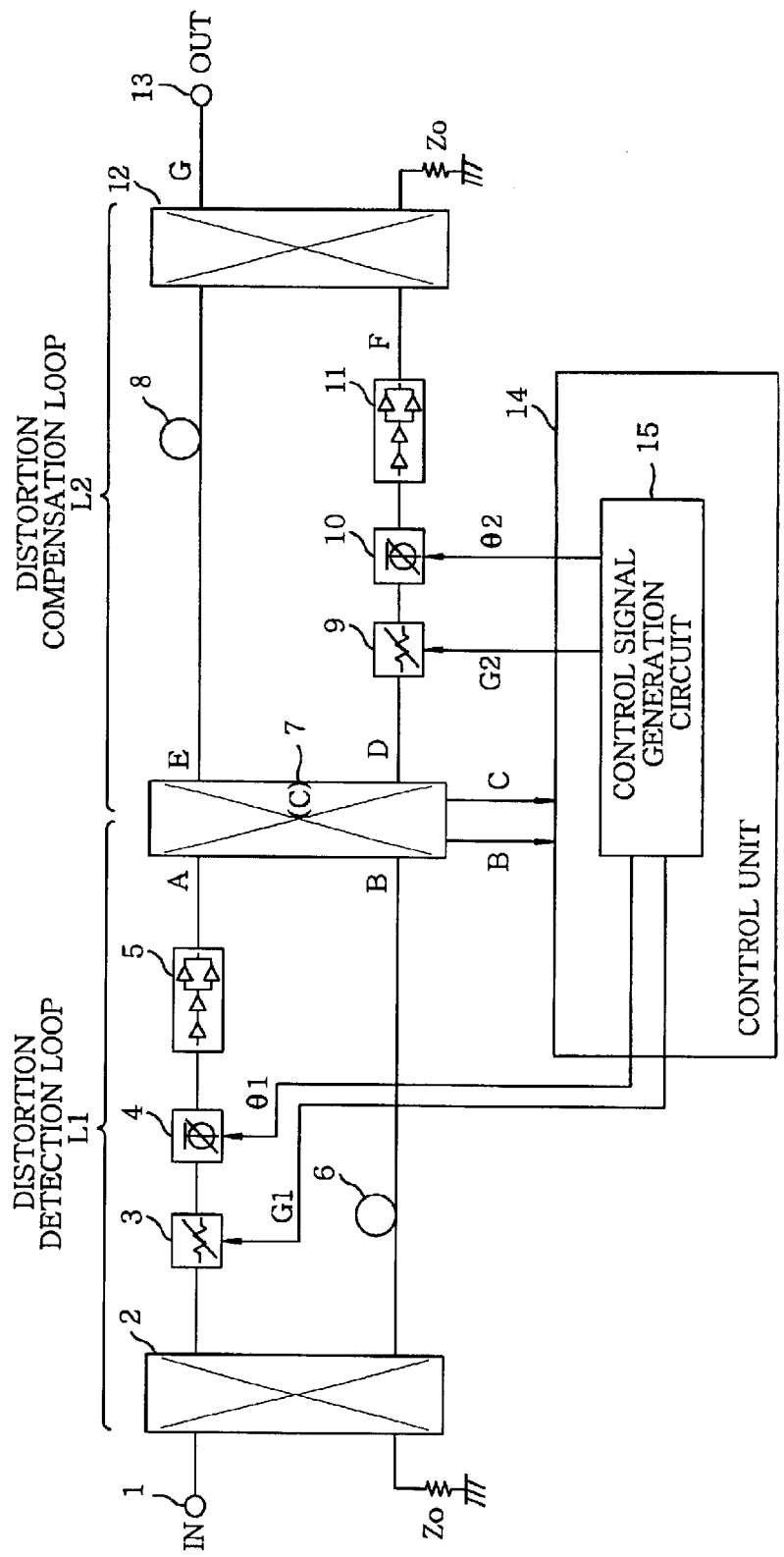
FIG. 3 is a block diagram illustrating a conventional feed forward type non-linear distortion compensation amplification apparatus.

The configuration of the apparatus shown in FIG. 1 is identical to that of FIG. 3, excepting the variable attenuator 16 installed between a divider 2 and a coaxial delay line 6 in a distortion detection loop L1. The variable attenuator 16 enables the amplitude of a divided signal B of the coaxial delay line 6 to be substantially equal to that of a secondary divided signal C obtained by a divider 7 from an output signal A of a main amplifier 5, even in the case where the main amplifier 5 is out of order due to a breakdown of an amplification element in the main amplifier 5 and as a result, a gain of the main amplifier 5 decreases too much to be compensated by a variable attenuator 3.

A divided signal B', which is obtained by dividing an input multi-carrier signal from an input terminal 1 by the divider 2, is attenuated by the variable attenuator 16. Thereafter, the attenuated signal is delayed by the coaxial delay line 6 and then provided to the divider 7 as the divided signal B, as in the conventional apparatus shown in FIG. 3. The remaining processes are identical to those of the conventional technique described with reference to FIG. 3.

In the variable attenuator 16, a predetermined initial value (e.g., a minimal amount of attenuation) is set in such a manner that an amount of the attenuation of the variable attenuator 16 can be increased by using a control signal G3 from a control unit 14. During a normal operation, the initial value is maintained at the variable attenuator 16 and the control unit 14 controls the amount of attenuation of the variable attenuator 3 and that of phase shift of a variable phase shifter 4 by control signals G1 and θ1 respectively, in such a manner that the amplitude of the secondary divided signal C from the output signal A of the main amplifier 5 equals to that of the divided signal B for the coaxial delay line 6.

The control unit 14, for example, receives the divided signals B and C from the divider 7 and then monitors the amplitudes thereof. If the amplitudes are not identical to each other, the control unit 14 controls the amount of the attenuation of the variable attenuator 3 by using the control signal G1 to make the amplitudes of the signals B and C equal.

If the gain of the main amplifier 5 decreases due to, e.g., a fault of an amplification element in the main amplifier 5, the control unit 14 decreases the amount of the attenuation of the variable attenuator 3 by using the control signal G1, to match the amplitudes of the divided signals B and C with each other. If, however, the amplitudes of the divided signals B and C cannot be controlled to be coincident with one another though the amount of the attenuation of the variable attenuator 3 is minimized, the control unit 14 controls (increases) the amount of the attenuation of the variable attenuator 16 by using the control signal G3, to thereby decrease the amplitude of the divided signal B. Accordingly, the amplitudes of the divided signals B and C can be controlled to become equal to each other.

Even though the amplitude of a multi-carrier signal G obtained from an output terminal 13 decreases in this case, a distortion-free multi-carrier signal can be obtained without disabling the amplification operation.

If the amplitude of the signal C cannot be produced to be identical to that of the signal B even with the maximum attenuation of the variable attenuator 16, the multi-carrier signal with effectively suppressed distortion cannot be obtained. Upon detecting such an instance, the control unit 14 cuts off the power by a device (not shown), to thereby terminate the amplification operation.

Figure 2:
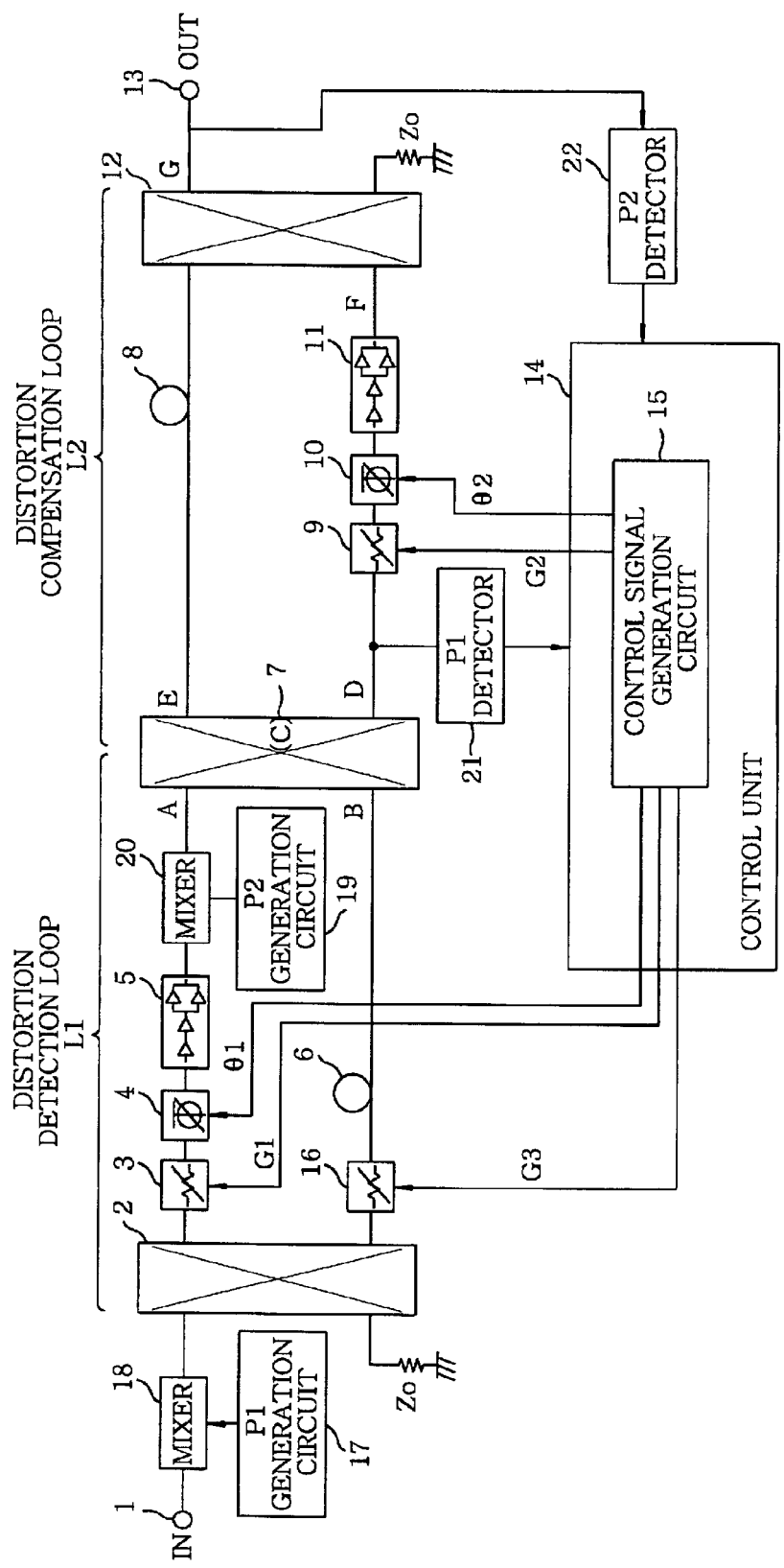
FIG. 2 describes a block diagram illustrating a feed forward type non-linear distortion compensation amplification apparatus in accordance with a second preferred embodiment of the present invention.

FIG. 2 describes a block diagram illustrating a feed forward type non-linear distortion compensation amplification apparatus in accordance with a second preferred embodiment of the present invention. The apparatus shown in FIG. 2 includes some elements identical to those of the apparatus shown in FIG. 1 and further includes a P1 and a P2 generation circuit 17 and 19, mixers 18 and 20, a P1 and a P2 detector 21 and 22. The same reference numerals of the apparatus shown in FIG. 2 are used to denote and identify corresponding or identical elements to those of the apparatus shown in FIG. 1 and the repeated description thereof will be omitted.

The apparatus of FIG. 2 in accordance with the second embodiment of the present invention monitors a gain of a main amplifier 5 by using pilot signals as used in the conventional technique disclosed in Japanese Patent Laid-Open Publication No. 1995-303050.

In FIG. 2, the P1 generation circuit 17 generates a pilot signal P1 with a frequency f1 and the mixer 18 mixes the pilot signal P1 with a multi-carrier signal from an input terminal 1. The mixed signal is provided to a distortion detection loop L1. The frequency f1 of the pilot signal P1 differs from any of the carrier frequencies of the multi-carrier signal inputted from the input terminal 1. In the distortion detection loop L1, the pilot signal P1 is processed together with the multi-carrier signal similarly as described in the first embodiment of FIG. 1. Therefore, the pilot signal P1 included in a divided signal B is subtracted from that contained in a secondary divided signal C at a divider 7 and if the amplitude of the divided signal B is equal to that of the secondary divided signal C, the pilot signal P1 is not included in a difference signal D from the divider 7.

The P1 detector 21, which serves to detect the pilot signal P1 from the difference signal D, provides a detection result to a control unit 14. As long as the pilot signal P1 is not detected by the P1 detector 21, the control unit 14 continues to assert an identical set of control signals (G1, θ1, G3) to maintain a same setting value of each circuit in the distortion detection loop L1. If, however, the pilot signal P1 is detected by the P1 detector 21 (i.e., the amplitude of the pilot signal P1≠0), the control unit 14 controls the amount of the attenuation of a variable attenuator 3 by using the control signal G1 to make the detected amplitude of the pilot signal P1 detected by the P1 detector 21 become zero.

The amplitude of the pilot signal P1 detected by the P1 detector 21 may not be controlled to become zero regardless of the control of the amount of the attenuation of the variable attenuator 3, e.g., due to the breakdown of an amplification element in the main amplifier 5. In such a case, the amount of the attenuation of a variable attenuator 16 is controlled to be increased by using the control signal G3, while minimizing the attenuation of the variable attenuator 3 (i.e., maximizing the amplitude of the pilot signal P1 mixed into an output signal A of the main amplifier 5). Accordingly, the detection amplitude of the pilot signal P1 at the P1 detector 21 can become zero.

If the detection amplitude does not become zero even with the control process described above, power is turned off to terminate the amplification operation by a device (not shown), as in the first preferred embodiment of FIG. 1.

Further, to control a distortion compensation loop L2, the P2 generation circuit 19 generating a pilot signal P2 with a frequency f2 is installed between the main amplifier 5 and the divider 7. The frequency f2 is different from any of the frequency f1 of the pilot signal P1 and the carrier frequencies of the multi-carrier signal. The pilot signal P2 is mixed into the output signal A of the main amplifier 5 by the mixer 20 and is provided to the divider 7 of the distortion compensation loop L2 and the pilot signal P2 is detected from the output signal of a divider 12 by the 22 detector 22.

The control unit 14 receives a detection output of the P2 detector 22 to determine the amplitude of the detection output and controls the amount of the attenuation of a variable attenuator 9 and the amount of the phase shift of a variable phase shifter 10 by using the control signals G2 and θ2 in such a manner that the detection amplitude of the P2 detector 22 becomes zero.

When the difference signal D outputted from the divider 7 is controlled not to include the multi-carrier signal and the pilot signal P1, the difference signal D is composed of the distortion component generated by the main amplifier 5 and the pilot signal P2. And if the amplitude and the phase of the distortion component included in an output signal E of the divider 7 is controlled to be identical to those of the distortion component outputted from an auxiliary amplifier 11, the pilot signals P2 included in the output signal E and a distortion signal F become to have a same amplitude and phase. The pilot signals P2 of the output signal E and that of the distortion signal F are subtraction-processed at the divider 12 and thus the pilot signal P2 cannot be detected by the P2 detector 22.

As described above with reference to the second embodiment of the present invention, the amount of the attenuation of the variable attenuators 3 and 16 and the amount of phase shift of a phase shifter 4 in the distortion detection loop L1 are controlled first in such a manner that the pilot signal P1 is not detected by the P1 detector 21. Thereafter, the amount of the attenuation of the variable attenuator 9 and the amount of phase shift of the phase shifter 10 in the distortion compensation loop L2 are set such that the pilot signal P2 is not detected by the P2 detector 22.

While the invention has been shown and described with respect to the preferred embodiments, it will be understood by those skilled in the art that various changes and modifications may be made without departing from the spirit and scope of the invention as defined in the following claims.

What is claimed is:

1. A feed forward type distortion compensation amplification apparatus, comprising:

a first division unit for dividing an input signal into a first channel signal and a second channel signal;

a first variable attenuation unit for attenuating an amplitude of the first channel signal;

a main amplifier for amplifying the first channel signal;

a second variable attenuation unit for processing the second channel signal to provide an amplitude adjusted second channel signal;

a delay unit for delaying the amplitude adjusted second channel signal to compensate for a delay of the first channel signal;

a second division unit for dividing an output signal of the main amplifier into a third channel signal and a fourth channel signal and subtracting one of the third channel signal and the delayed second channel signal from the other to extract a distortion component introduced by the main amplifier; and a distortion compensation unit for removing a distortion component introduced into the fourth channel signal by the main amplifier, by using the distortion component extracted by the second division unit; and a controller for controlling the first variable attenuation unit and the second variable attenuation unit sequentially by using data obtained by comparing amplitudes of the amplitude adjusted second channel signal and the third channel signal when a fault of the main amplifier occurs.

* * * * *